United States Patent
Ebiya

(10) Patent No.: US 6,549,000 B2
(45) Date of Patent: Apr. 15, 2003

(54) SEMICONDUCTOR DEVICE TESTING APPARATUS HAVING TIMING HOLD FUNCTION

(75) Inventor: Koichi Ebiya, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/205,742

(22) Filed: Jul. 26, 2002

(65) Prior Publication Data

US 2002/0186003 A1 Dec. 12, 2002

Related U.S. Application Data

(62) Division of application No. 09/624,507, filed on Jul. 24, 2000, now Pat. No. 6,479,983.

(30) Foreign Application Priority Data

Jul. 23, 1999 (JP) ........................................ 1999-208653

(51) Int. Cl.$^7$ ................................................. G11B 5/00
(52) U.S. Cl. .................................. 324/158.1; 714/700
(58) Field of Search ........................ 324/158.1; 714/700, 714/814, 815

(56) References Cited

U.S. PATENT DOCUMENTS 4,497,056 A * 1/1985 Sugamori .................... 714/736
4,929,888 A * 5/1990 Yoshida ....................... 714/736

* cited by examiner

Primary Examiner—Kamand Cuneo
Assistant Examiner—Russell M. Kobert
(74) Attorney, Agent, or Firm—David N. Lathrop, Esq.; Gallagher & Lathrop

(57) ABSTRACT

There is provided a semiconductor device testing apparatus capable of greatly decreasing an interrupted time of a testing even if a board on which a test pattern supply path and/or a strobe pulse supply path is provided is replaced. A signal propagation delay time of the test pattern supply path through which a test pattern signal is supplied to a semiconductor device under test and a signal propagation delay time of the strobe pulse supply path through which a strobe pulse is supplied to a signal read circuit reading therein a logical value of a response signal outputted from the semiconductor device under test are measured respectively, and differences between the measured respective values and predetermined corresponding delay times are found respectively. The obtained time differences are stored as delay correcting data in a non-volatile memory or corresponding non-volatile memories.

10 Claims, 7 Drawing Sheets

SEMICONDUCTOR DEVICE TESTING APPARATUS HAVING TIMING HOLD FUNCTION

CROSS-REFERENCE TO RELATED APPLICATIONS

This application is a divisional application of U.S. patent application Ser. No. 09/624,507, filed Jul. 24, 2000, now U.S. Pat. No. 6,479,983.

BACKGROUND OF THE INVENTION

1. Field of the Invention

The present invention relates to a semiconductor device testing apparatus for testing various kinds of semiconductor devices including a semiconductor integrated circuit and determining whether the tested semiconductor device is a defective (failure) article or not, and more particularly, relates to such a semiconductor device testing apparatus having timing hold function which is capable of conforming the timing at which a test pattern signal is applied to each of terminals of a semiconductor device tinder test and the timing at which a response output signal outputted from each of terminals of the semiconductor device under test is fetched or read in, to a predetermined set value for each terminal.

2. Description of the Related Art

A prior semiconductor device testing apparatus for testing various kinds of semiconductor devices and determining whether the tested semiconductor device is a defective article or not is shown in FIG. 4. Here, for clarity of the description, in FIG. 4 is shown an outline of the construction of a semiconductor integrated circuit testing apparatus for testing a semiconductor integrated circuit (hereinafter, referred to as IC) which is a typical of semiconductor devices and determining whether the tested IC is a defective article or not.

The IC testing apparatus TES comprises, roughly speaking, a controller 11, a pattern generator 12, a timing generator 13, a waveform generating part 14, a logical comparator 15, a driver 16, an analog level comparator (hereinafter referred to as comparator) 17, a failure analysis memory 18, a logical amplitude reference voltage source 21, a comparison reference voltage source 22, and a device power source 23.

The controller 11 is generally constituted by a computer system, in which a test program PM created by a user (programmer) is stored in advance, and the entire IC testing apparatus is controlled in accordance with the test program PM. The controller 11 is connected, via a tester bus BUS, to the pattern generator 12, the timing generator 13, and the like. Although not shown, the logical amplitude reference voltage source 21, the failure analysis memory 18, the logical amplitude reference voltage source 21, the comparison reference voltage source 22, and the device power source 23 are also connected to the controller 11.

First of all, before the testing of an IC is started, various kinds of data are set by the controller 11. After the various kinds of data have been set, the testing of an IC is started. When the controller 11 gives a test starting instruction or command to the pattern generator 12, the pattern generator 12 starts to generate a pattern. The pattern generator 12 supplies test pattern data to the waveform generating part 14, in accordance with the test program PM.

The timing generator 13 generates timing signals (clock pulses) for defining timings of rise and fall of the waveform of a test pattern signal applied to an IC to be tested (IC under test) 19 respectively, and also generates a timing signal (clock pulse) for a strobe pulse which defines a timing of a logical comparison between an expected value pattern signal and a response signal in the logical comparator 15, and the like.

Timings and periods that those timing signals are to be generated are described in the test program PM created by a user, and it is arranged that a test pattern signal can be applied to the IC under test 19 with an operating period and at a timing designed or established by the user to actually operate the IC under test, and whether that operation of the IC under test is normal or not can be tested.

The waveform generating part 14 converts the test pattern data supplied from the pattern generator 12 into a test pattern signal having a real waveform. This test pattern signal is applied to the IC under test 19 via the driver 16 that amplifies the voltage of the test pattern signal to a waveform having an amplitude value set by the logical amplitude reference voltage source 21.

A response signal read out from the IC under test 19 is compared with a reference voltage supplied from the comparison reference voltage source 22 in the comparator 17, and it is determined whether or not the response signal has a predetermined logical level, i.e., whether or not the response signal has a predetermined logical H (logical high) voltage or logical L (logical low) voltage. A response signal determined to have the predetermined logical level is sent to the logical comparator 15, where the response signal is compared with an expected value pattern signal outputted from the pattern generator 12, and whether or not the IC under test 19 has outputted a normal response signal is determined.

In case that the IC under test 19 is a memory element, if the response signal does not coincide with the expected value pattern signal, the logical comparator 15 determines that the memory cell having an address of the IC under test 19 from which the response signal has been read out is defective (failure), and generates a failure signal indicating that fact. Usually, when the failure signal is generated, a writing of a failure data (generally logical "1" signal) in the failure analysis memory 18 applied to a data input terminal thereof is enabled, and the failure data is stored in an address of the failure analysis memory 18 specified by an address signal being supplied to the failure analysis memory 18 at that time.

The failure analysis memory 18 has its operating rate or speed and its memory capacity equivalent to those of the IC under test 19, and the same address signal as the address signal applied to the IC under test 19 is also applied to this failure analysis memory 18. In addition, the failure analysis memory 18 is initialized prior to the start of a testing. For example, when initialized, the failure analysis memory 18 has data of logical "0s" written in all of the addresses thereof. Every time a failure signal indicating that the anti-coincidence is generated from the logical comparator 15 during a testing of the IC under test 19, a failure data of logical "1" indicating the failure of a memory cell is written in the same address of the failure analysis memory 18 as that of the memory cell of the IC under test 19 from which that anti-coincidence has occurred.

On the contrary, when the response signal coincides with the expected value pattern signal, the logical comparator 15 determines that the memory cell having an address of the IC under test 19 from which the response signal has been read out is not defective (pass), and generates a pass signal indicating that fact. Usually, this pass signal is not stored in the failure analysis memory 18.

After the testing has been completed, the failure data stored in the failure analysis memory 18 are read out therefrom into a failure relief analyzer not shown, and it is determined, for example, whether a relief or repair of failure memory cells of the tested IC is possible or not.

Further, in FIG. 4, the block diagram is depicted such that the test pattern signal outputted from the driver 16 is applied to only one input terminal of the IC under test 19, and that a response signal from one output terminal of the IC under test 19 is supplied to the comparator 17. However, the number of drivers 16 provided is actually equal to the number of input terminals of the IC under test 19, for example 512, and the number of comparators 17 provided is also equal to the number of output terminals of the IC under test 19 (since the number of input terminals provided is usually equal to the number of output terminals, the number of comparators 17 provided is equal to the number of drivers 16 provided). In addition, although the input terminals of the IC under test 19 are depicted, in FIG. 4, as separate terminals from the output terminals of the IC under test 19, there are many cases in general that each terminal of the IC under test 19 is used in common as both the input terminal and the output terminal.

The IC under test 19 is mounted on an IC socket of a test head (not shown) constructed separately from the IC testing apparatus proper. Usually, a member called "performance board" is mounted on the upper portion of the test head, and a predetermined number of IC sockets are mounted on the performance board. Accordingly, the IC under test 19 will be mounted on associated one of the IC sockets. In addition, a board (printed board) (hereinafter, referred to as pin card) called "pin card" in this technical field is accommodated inside the test head. Usually, a circuit including the waveform generating part 14, the driver 16 and the comparator 17 of the IC testing apparatus TES is formed on this pin card. There are many cases that the pin card is prepared for each terminal (pin) of the IC under test 19, and is arranged such that when a trouble or failure occurs in any pin card, it is exchangeable for a non-defective pin card. In general, the test head is mounted on a test section of an IC transporting and handling apparatus called handler in this technical field, and is electrically connected to the IC testing apparatus proper by signal transmission means such as a cable, an optical fiber or the like.

FIG. 5 shows an example of the circuit configuration of a pin card. A pin card PCAD shown in FIG. 5 is one for input terminal connected to an input terminal of the IC under test 19, and includes the waveform generating part 14 described above, the driver 16 described above, and a register RG1 to which a delay correcting data is transferred from the controller 11. The test pattern signal outputted from the waveform generating part 14 is applied to one of the input terminals of the IC under test 19 through a test pattern supply path via the driver 16. Although FIG. 5 shows two pin cards PCAD, in reality there are provided, as mentioned above, one pin card PCAD shown in FIG. 5 is connected to each of the all input terminals of the IC under test 19. That is, the same number of pin cards corresponds to the number of input terminals of the IC under test 19 are housed in the test head.

Moreover, each pin card PCAD further includes a variable delay element DY1 provided between the waveform generating part 14 and the driver 16. A delay correcting data is given to the variable delay element DY1 from the register RG1 to adjust the delay time inherent to each pin card PCAD so that a test pattern signal outputted from the waveform generating part 14 can be applied to one of the input terminals of the IC under test 19 in phase with other test pattern signals applied to other input terminals thereof. Such adjustment is generally called "skew adjustment" in this technical field.

There are various kinds of skew adjustment methods. As an example, a reference pin card used as a reference timing is selected among a plurality of pin cards PCAD. Then, a difference of phase between a signal outputted from the reference pin card and a signal outputted from a pin card to be calibrated is found, and finds a delay time for the variable delay element DY1 by which the found phase difference becomes zero (0). Thereafter, the found delay time is fetched in and stored in a delay correcting data storage 11A in a controller 11 as delay correcting data P1, P2, . . . . At the start of a testing, those delay correcting data P1, P2, P3, . . . are transferred from the controller 11 to registers RG1 provided in respective pin cards PCAD so that delay times of corresponding variable delay elements DY1 are set through the associated registers RG1, respectively. After that, the testing is started.

FIG. 6 shows another example of the circuit configuration of a pin card. A pin card PCAD shown in FIG. 6 is one for output terminal connected to an output terminal of the IC under test 19, and includes the above-described comparator 17 to which an response signal outputted from one of the output terminals of the IC under test 19 is supplied, a signal read circuit DF provided at the subsequent stage to the comparator 17, and a register RG2 to which a delay correcting data is transferred from the controller 11. A strobe pulse STB is applied to the signal read circuit DF from the timing generator 13 to fetch or read a logical signal being outputted from the comparator 17 in the signal read circuit DF. The signal read circuit DF may be constructed by D-type flip-flop, for example.

Each pin card PCAD shown in FIG. 6 further includes a variable delay element DY2 inserted in a strobe pulse supply path provided for the purpose of supplying a strobe pulse STB from the timing generator 13 to the signal read circuit DF. In other words, through this strobe pulse supply path a strobe pulse STB from the timing generator 13 passes to the signal read circuit DF. A delay correcting data is given to the variable delay element DY2 from the register RG2 to adjust the delay time of the variable delay element DY2 so that the timing of a strobe pulse applied to the signal read circuit DF coincides with the reference timing.

The delay time of each of the pin cards PCAD is different from one another. Therefore, delay correcting data for correcting such unevenness of the delay times are previously stored in the controller 11, and each time a testing is started, the stored delay correcting data are transferred from the controller 11 to the corresponding registers RG2 provided in the respective pin cards PCAD to adjust the delay times of the variable delay elements DY2 by use of the delay correcting data set in the registers RG2 so that the timings of the strobe pulses STB applied to the signal read circuit DF can be in accord with one another. Although FIG. 6 shows two pin cards PCAD, in reality there are provided, as mentioned above, one pin card PCAD shown in FIG. 6 is connected to each of the all output terminals of the IC under test 19. That is, the same number of pin cards corresponds to the number of output terminals of the IC under test 19 are housed in the test head.

FIG. 7 shows still another example of the circuit configuration of a pin card. A pin card PCAD shown in FIG. 7 is one for both of input and output terminals connected to an input/output terminal (I/O terminal) of the IC under test 19, and is a combination of the circuit configurations of the pin cards mentioned above and shown in FIGS. 5 and 6. Accordingly, the pin card PCAD shown in FIG. 7 is constituted by the waveform generating part 14, the driver 16, the variable delay element DY1, the register RG1 for setting the delay time of the delay element DY1, the comparator 17, the signal read circuit DF, the variable delay element DY2, and the register RG2 for setting the delay time of the delay element DY2. In the register RG1 is set a delay correcting data for the test pattern supply path from the controller 11, and in the register RG2 is set a delay correcting data for the strobe pulse supply path from the controller 11 so that the timing of a test pattern signal propagating through the test pattern supply path and the timing of a strobe pulse propagating through the strobe pulse supply path can be in accord with those of other test pattern signals and those of other strobe pulses, respectively. In general, the pin card of this type is mostly used.

Afore-mentioned delay correcting data are obtained by mounting each pin card PCAD on a predetermined location within the IC testing apparatus TES and by actually operating the IC testing apparatus TES to measure the propagation delay time of the test pattern signal and the propagation delay time of the strobe pulse for each pin card. The measurement results are stored in the delay correcting data storage 11A such as, for example, a hard disk provided in the controller 11.

At the start of the testing, the controller 11 transfers the delay correcting data stored in its delay correcting data storage 11A to the registers RG1 and/or RG2 provided in each of the pin cards PCAD, thereby to set the signal propagation delay times of each pin card, and thereafter the testing is started.

As mentioned above, the prior IC testing apparatus is constructed such that the delay correcting data are previously measured and stored in the controller 11, and at the start of a testing, the stored delay correcting data are transferred from the controller 11 to the registers RG1 and/or RG2 provided in each pin card, thereby to set the delay times of the variable delay elements DY1 and/or DY2. Accordingly, if a pin card PCAD should be in trouble or failure during the testing and this trouble pin card has been replaced with another one, the delay correcting data for the new pin card PCAD must be newly measured once more. To measure the delay correcting data for the new pin card PCAD once more results in the actual operation of the IC testing apparatus TES as stated above, which takes a long time. As a result, there is a drawback in the prior IC testing apparatus that the interruption time of the testing becomes long.

In other words, since an IC testing apparatus is very expensive, if such an expensive apparatus should be stopped for a long time, the operating or running efficiency of the IC testing apparatus is decreased, which results in a drawback that the cost required for the testing is increased.

In addition, as another drawback, there is a possibility that the testing is started again with a new pin card PCAD substituted for the trouble pin card without measuring the delay correcting data for the new pin card. In this case, a delay correcting data transferred from the controller 11 to the new pin card is not data for the new pin card (is data for the former trouble pin card replaced by the new pin card). Accordingly, the delay time of the variable delay element is erroneously set, and an incorrect test result is obtained, resulting in a problem in reliability.

SUMMARY OF THE INVENTION

It is a first object of the present invention to provide a semiconductor device testing apparatus having timing hold function which is capable of decreasing a waiting time until a testing is re-started even if a board on which a test pattern supply path and/or a strobe pulse supply path is provided is replaced.

It is a second object of the present invention to provide a semiconductor device testing apparatus having timing hold function which has no possibility that in case a board on which a test pattern supply path and/or a strobe pulse supply path is provided is replaced, a delay correcting data for the former pin card replaced by a new pin card is inadvertently used.

In order to accomplish the aforesaid objects, there is provided, in a first aspect of the present invention, a semiconductor device testing apparatus comprising: a test pattern supply path through which a test pattern signal is supplied to a semiconductor device under test; a variable delay element for adjusting the signal propagation delay time of said test pattern supply path; a register for setting a delay time of said variable delay element; a non-volatile memory; delay correcting data setting means for causing delay correcting data to be stored in said non-volatile memory, said delay correcting data correcting the signal propagation delay time of said test pattern supply path to a prescribed value; and data transfer means for causing the delay correcting data stored in said non-volatile memory to be transferred to said register.

In a first preferred embodiment, the test pattern supply path, the variable delay element, the register and the non-volatile memory are provided on a board called pin card.

The delay correcting data is a difference value between the signal propagation delay time of said test pattern supply path and said prescribed value. Also, the signal propagation delay time of the test pattern supply path is measured before the board is mounted in the semiconductor device testing apparatus.

The delay correcting data stored in said non-volatile memory is transferred to said register by that a controller for controlling the operation of the semiconductor device testing apparatus outputs a transfer instruction of delay correcting data to the non-volatile memory in the initialization setting operation thereof at the start of a testing, thereby to calibrate the signal propagation delay time of said test pattern supply path to the prescribed value.

As a first modification, the testing apparatus may be arranged such that a circuit configuration constituted by said test pattern supply path, said variable delay element, said register and said non-volatile memory is provided as many as plural channels on a board called pin card, and delay correcting data for correcting the signal propagation delay time of each of the test pattern supply paths to said prescribed value is stored in corresponding one of the non-volatile memories.

As a second modification, the testing apparatus may be arranged such that a circuit configuration constituted by said test pattern supply path, said variable delay element and said register is provided as many as plural channels on a board called pin card as well as said non-volatile memory is used in common to the respective test pattern supply paths in the plural channels, and delay correcting data for correcting the signal propagation delay time of each of the test pattern supply paths to said prescribed value is stored in said non-volatile memory.

In a second aspect of the present invention, there is provided a semiconductor device testing apparatus comprising: a signal read circuit for reading therein a logical value of a response signal outputted from a semiconductor device under test; a strobe pulse supply path through which a strobe pulse is supplied to said signal read circuit, said strobe pulse giving to said signal read circuit a timing at which the signal read circuit reads therein the logical value; a variable delay element for adjusting the signal propagation delay time of said strobe pulse supply path; a register for setting a delay time of said variable delay element; a non-volatile memory; delay correcting data setting means for causing delay correcting data to be stored in said non-volatile memory, said delay correcting data correcting the signal propagation delay time of said strobe pulse supply path to a prescribed value; and data transfer means for causing the delay correcting data stored in said non-volatile memory to be transferred to said register.

In a second preferred embodiment, said signal read circuit, said strobe pulse supply path, said variable delay element, said register and said non-volatile memory are provided on a board called pin card.

The delay correcting data is a difference value between the signal propagation delay time of said strobe pulse supply path and said prescribed value. Also, said signal propagation delay time of said strobe pulse supply path is measured before said board is mounted in the semiconductor device testing apparatus.

The delay correcting data stored in said non-volatile memory is transferred to said register by that a controller for controlling the operation of the semiconductor device testing apparatus outputs a transfer instruction of delay correcting data to the non-volatile memory in the initialization setting operation thereof at the start of a testing, thereby to calibrate the signal propagation delay time of said strobe pulse supply path to the prescribed value.

As a first modification, the testing apparatus may be arranged such that a circuit configuration constituted by said signal read circuit, said strobe pulse supply path, said variable delay element, said register and said non-volatile memory is provided as many as plural channels on a board called pin card, and delay correcting data for correcting the signal propagation delay time of each of the strobe pulse supply paths to said prescribed value is stored in corresponding one of the non-volatile memories.

As a second modification, the testing apparatus may be arranged such that a circuit configuration constituted by said signal read circuit, said strobe pulse supply path, said variable delay element and said register is provided as many as plural channels on a board called pin card as well as said non-volatile memory is used in common to the respective strobe pulse supply paths in the plural channels, and delay correcting data for correcting the signal propagation delay time of each of the strobe pulse supply paths to said prescribed value is stored in said non-volatile memory.

In a third aspect of the present invention, there is provided a semiconductor device testing apparatus comprising: a test pattern supply path through which a test pattern signal is supplied to a semiconductor device under test; a first variable delay element for adjusting the signal propagation delay time of said test pattern supply path; a first register for setting a delay time of said first variable delay element, a first non-volatile memory; a signal read circuit for reading therein a logical value of a response signal outputted from a semiconductor device under test; a strobe pulse supply path through which a strobe pulse is supplied to said signal read circuit, said strobe pulse giving to said signal read circuit a timing at which the signal read circuit reads therein the logical value; a second variable delay element for adjusting the signal propagation delay time of said strobe pulse supply path; a second register for setting a delay time of said second variable delay element; a second non-volatile memory; delay correcting data setting means for causing first delay correcting data to be stored in said first non-volatile memory, said first delay correcting data correcting the signal propagation delay time of said test pattern supply path to a prescribed value as well as for causing second delay correcting data to be stored in said second non-volatile memory, said second delay correcting data correcting the signal propagation delay time of said strobe pulse supply path to a prescribed value; and data transfer means for causing the first delay correcting data stored in said first non-volatile memory to be transferred to said first register as well as for causing the second delay correcting data stored in said second non-volatile memory to be transferred to said second register.

In a third preferred embodiment, said test pattern supply path, said first and second variable delay elements, said first and second registers, said signal read circuit, said strobe pulse supply path, and said first and second non-volatile memories are provided on a board called pin card.

The first delay correcting data is a difference value between the signal propagation delay time of said test pattern supply path and said prescribed value, and said second delay correcting data is a difference value between the signal propagation delay time of said strobe pulse supply path and said prescribed value.

The signal propagation delay time of said test pattern supply path and said signal propagation delay time of said strobe pulse supply path are measured before said board is mounted in the semiconductor device testing apparatus.

The first and second delay correcting data stored respectively in said first and second non-volatile memories are transferred to said first and second registers respectively by that a controller for controlling the operation of the semiconductor device testing apparatus outputs a transfer instruction of delay correcting data to the first and second non-volatile memories in the initialization setting operation thereof at the start of a testing, thereby to calibrate the signal propagation delay times of said strobe pulse supply path and said strobe pulse supply path to the respective prescribed values.

As a first modification, the testing apparatus may be arranged such that in place of the first and second non-volatile memories, only one nonvolatile memory is provided, and both of the first and second delay correcting data are stored in the non-volatile memory.

In this first modification, said test pattern supply path, said first and second variable delay elements, said first and second registers, said signal read circuit, said strobe pulse supply path, and said non-volatile memory are provided on a board called pin card.

In addition, said first and second delay correcting data stored in said non-volatile memory are transferred to said first and second registers respectively by that a controller for controlling the operation of the semiconductor device testing apparatus outputs a transfer instruction of delay correcting data to the non-volatile memory in the initialization setting operation thereof at the start of a testing, thereby to calibrate the signal propagation delay times of said strobe pulse supply path and said strobe pulse supply path to the respective prescribed values.

As a second modification, the testing apparatus may be arranged such that a circuit configuration constituted by said test pattern supply path, said first variable delay element, said first register and said first non-volatile memory is provided as many as plural channels on a board called pin card, and a circuit configuration constituted by said strobe pulse supply path, said second variable delay element, said second register, said signal read circuit and said second non-volatile memory is provided as many as plural channels on said board, and said first delay correcting data for correcting the signal propagation delay time of each of the test pattern supply paths to the prescribed value and said second delay correcting data for correcting the signal propagation delay time of each of the strobe pulse supply paths to the prescribed value are stored in corresponding one of said first non-volatile memories and corresponding one of said second non-volatile memories respectively.

As a third modification, the testing apparatus may be arranged such that a circuit configuration constituted by said test pattern supply path, said first and second variable delay elements, said first and second registers, said signal read circuit, said strobe pulse supply path, and said non-volatile memory is provided as many as plural channels on a board called pin card, and said first delay correcting data for correcting the signal propagation delay time of the test pattern supply path to the prescribed value and said second delay correcting data for correcting the signal propagation delay time of the strobe pulse supply path to the prescribed value in each channel are stored in the non-volatile memory in the same channel.

As a fourth modification, the testing apparatus may be arranged such that a circuit configuration constituted by said test pattern supply path, said first and second variable delay elements, said first and second registers, said signal read circuit, and said strobe pulse supply path is provided as many as plural channels on a board called pin card, and said non-volatile memory is used in common to the plural channels, and said first delay correcting data for correcting the signal propagation delay time of the test pattern supply path to the prescribed value and said second delay correcting data for correcting the signal propagation delay time of the strobe pulse supply path to the prescribed value in each channel are stored in the non-volatile memory.

According to the semiconductor device testing apparatus having a timing hold function according to the present invention, it is configured such that upon completion of the assembly of a pin card, a signal propagation delay time or times of a test pattern supply path and/or a strobe pulse supply path provided on each pin card is measured in the state of a single pin card, and in order to conform the measured signal propagation delay time or times to a predetermined value, delay correcting data to be set in a variable delay element is found, and the obtained delay correcting data is stored in a non-volatile memory or memories provided on each pin card. Accordingly, at the time point that any trouble or defect occurs in a pin card and even if the trouble pin card is replaced by any new pin card, the delay time of the variable delay element can be set by utilizing the delay correcting data stored in the non-volatile memory in the new pin card. Therefore, the testing can be re-started immediately without measuring the propagation delay time.

In other words, it is not necessary to measure the signal propagation delay time or times of the test pattern supply path and/or the strobe pulse supply path provided in each of the pin cards every time a pin card is replaced. Accordingly, there is obtained a remarkable advantage that the interrupted time duration of the testing can be decreased significantly.

Moreover, in accordance with the semiconductor device testing apparatus according to the present invention, since delay correcting data stored in the non-volatile memory or memories is set in the variable delay element or elements to initialize it without fail when the testing apparatus is started, there is no possibility that an incorrect operation occurs that the testing apparatus operates by using delay correcting data for the former trouble pin card. Consequently, a highly reliable semiconductor device testing apparatus can be provided.

DETAILED DESCRIPTION OF THE PREFERRED EMBODIMENTS

Figure 1:
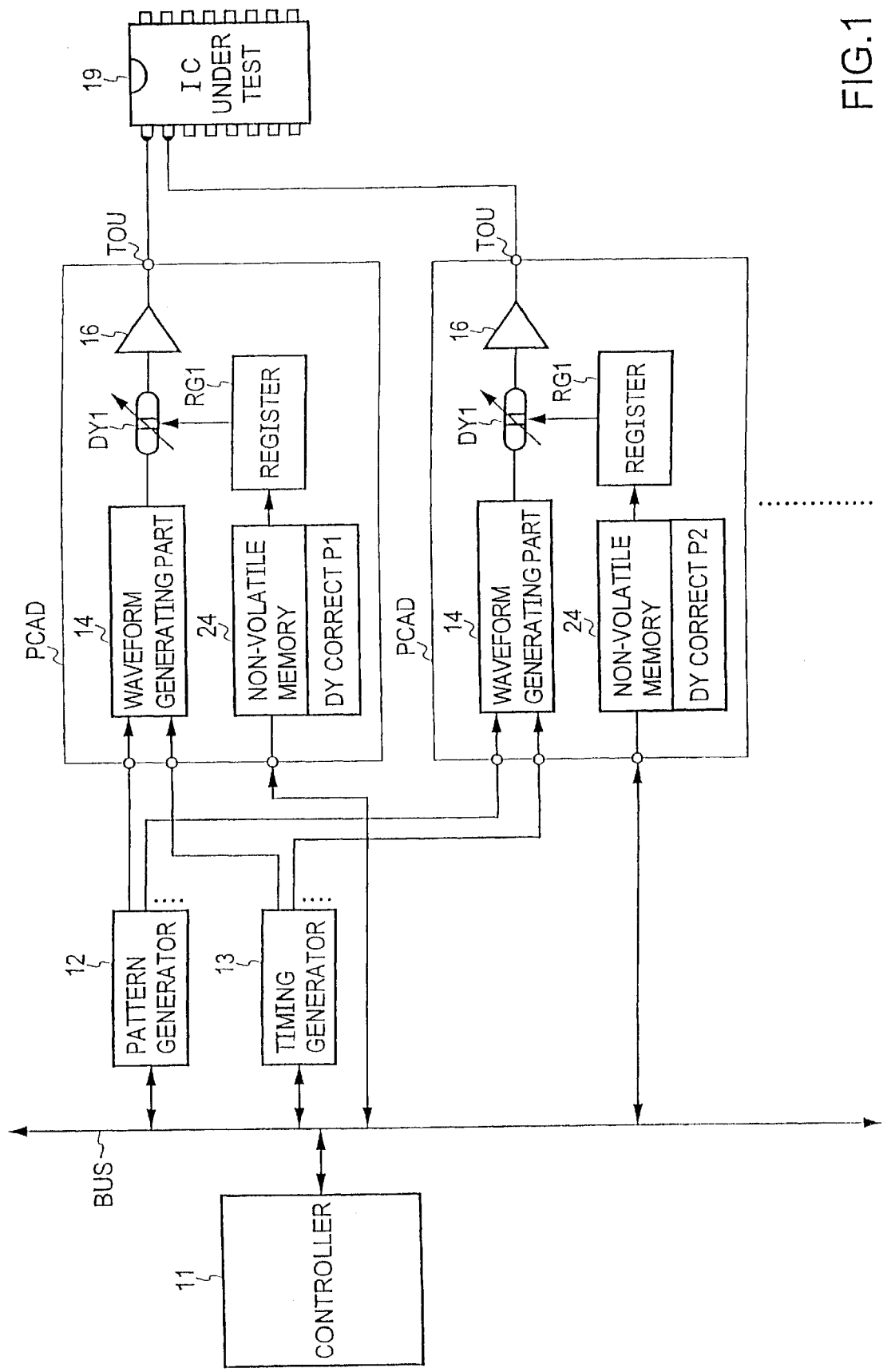
FIG. 1 is a block diagram showing the essential part of the first embodiment of a semiconductor device testing apparatus according to the present invention.

Now, preferred embodiments of a semiconductor device testing apparatus according to the present invention will be described in detail with reference to FIGS. 1 to 3. Further, in FIGS. 1 to 3, portions and elements corresponding to those shown in FIGS. 4 to 7 will be shown by the same reference characters affixed thereto, and the explanations thereof will be omitted unless necessary.

FIG. 1 is a block diagram showing the configuration of the essential part of the first embodiment that the present invention is applied to an IC testing apparatus for testing an IC and determining whether the tested IC is a defective article or not. FIG. 1 shows mainly the circuit configuration of a pin card. The illustrated pin card PCAD is one for input terminal corresponding to the aforementioned pin card described with reference to FIG. 5, and includes a waveform generating part 14, a driver 16, a variable delay element DY1, and a register RG1 for setting a delay time of the variable delay element DY1, as described before. The present invention is applied to such input terminal pin card PCAD thus constructed.

In the first embodiment, a non-volatile memory 24 is provided on each of the pin cards PCAD, and a delay correcting data to be set in the variable delay element DY1 is stored in the non-volatile memory 24. The non-volatile memory 24 is connected to the register RG1, and delay correcting data stored in the non-volatile memory 24 is transferred to the register RG1 at the start of a testing. As the non-volatile memory 24, a memory called a flash memory or the like, for example, and having a function capable of maintaining the stored data even if the power supply is cut-off, can be used.

Delay correcting data is stored in the non-volatile memory 24 in the following manner. First, in the state of a single pin card, a signal propagation delay time of the test pattern supply path from an output terminal of the waveform generating part 14 until an output terminal TOU of the pin card PCAD is measured. An oscilloscope (not shown) can be used for such measurement of the signal propagation delay time. As a measurement condition, the measurement is carried out in the state that the delay time of the variable delay element DY1 is set to zero. It is assumed that the measurement result is, for example, 9 PS (pico seconds). It is also assumed that a predetermined delay time is, for example, 15 PS (pico seconds). In this case, it is proper to give a delay time of 6 PS to the variable delay element DY1. As a result, it is proper to store in the non-volatile memory 24 a delay correcting data for giving a delay time of 6 PS to the variable delay element DY1.

With the construction mentioned above, in respect of any one of the pin cards PCAD, the propagation delay time of the test pattern supply path in each pin card PCAD can be adjusted to the predetermined value, for example, 15 PS by setting the delay correcting data stored in the non-volatile memory 24 in the register RG1 in each pin card PCAD.

Accordingly, in case that this pin card PCAD is mounted in the IC testing apparatus, in the initialization setting operation at the start of the testing, a delay correcting data stored in the non-volatile memory 24 is transferred to the register RG1 by sending a transfer instruction or command of data from the controller 11 to the non-volatile memory 24. By this transfer of the delay correcting data to the register RG1, the delay time of the variable delay element DY1 is set to a difference of delay time between the prescribed delay time and the propagation delay time of the test pattern supply path, and hence the propagation delay time of the test pattern supply path provided on each pin card PCAD is in accord with the prescribed delay time. Thus, at the start of the testing, the calibration of the propagation delay time of the test pattern supply path provided on each pin card PCAD is completed.

As a result, even if a pin card becomes in trouble or failure during the testing, by replacing the trouble pin card by a new pin card and sending a transfer instruction of the delay correcting data from the controller 11 to the register RG1 of the replaced new pin card, the calibration of the propagation delay time of the new pin card PCAD has been completed. Accordingly, there is obtained an advantage that the IC testing apparatus can be recovered in a short time from the trouble state.

Figure 2:
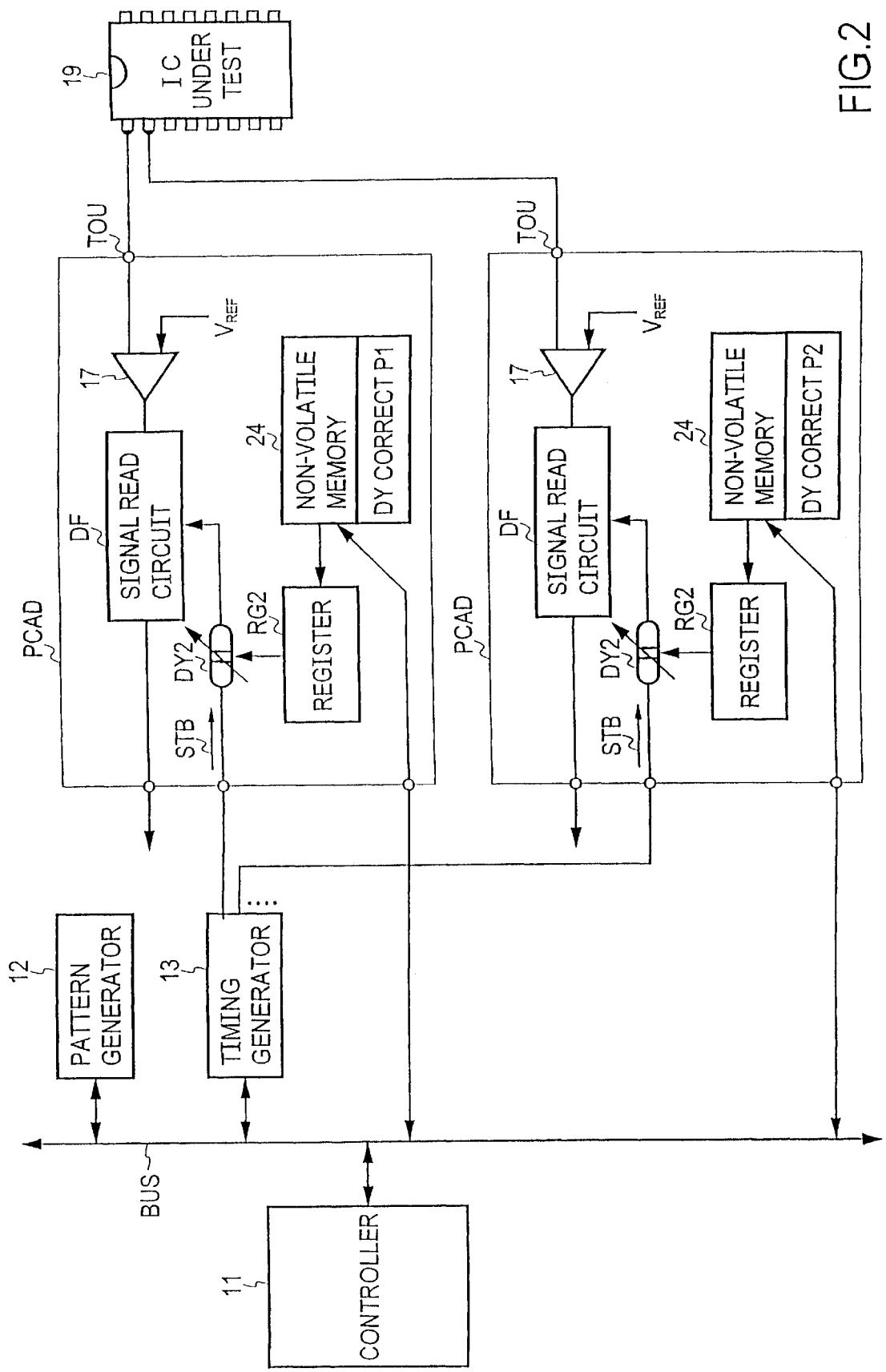
FIG. 2 is a block diagram showing the essential part of the second embodiment of the semiconductor device testing apparatus according to the present invention.

FIG. 2 is a block diagram showing the configuration of the essential part of the second embodiment that the present invention is applied to an IC testing apparatus for testing an IC and determining whether the tested IC is a defective article or not. FIG. 2 shows mainly the circuit configuration of a pin card. The illustrated pin card PCAD is one for output terminal corresponding to the aforementioned pin card described with reference to FIG. 6, and includes a comparator 17, a signal read circuit DF, a variable delay element DY2, and a register RG2 for setting a delay time of the variable delay element DY2, as described before. The present invention is applied to such output terminal pin card PCAD thus constructed.

In the second embodiment, a non-volatile memory 24 is also provided on each of the pin cards PCAD, and a delay correcting data to be set in the variable delay element DY2 is stored in the non-volatile memory 24. The non-volatile memory 24 is connected to the register RG2, and delay correcting data stored in the non-volatile memory 24 is transferred to the register RG2 at the start of a testing. As the non-volatile memory 24, a memory called a flash memory or the like, for example, and having a function capable of maintaining the stored data even if the power supply is cut-off, can be used.

Delay correcting data is stored in the non-volatile memory 24 in the following manner. First, in the state of a single pin card, a signal propagation delay time of the strobe pulse supply path through which a strobe pulse STB is supplied to the signal read circuit DF is measured. It is proper to find difference between the measured delay time and the prescribed delay time and to store the difference value in the non-volatile memory 24 as a delay correcting data.

With the construction mentioned above, in respect of any one of the pin cards PCAD, the propagation delay time of the strobe pulse supply path in each pin card PCAD can be adjusted to the predetermined value, for example, 15 PS by setting the delay correcting data stored in the non-volatile memory 24 in the register RG2 in each pin card PCAD.

Accordingly, in case that this pin card PCAD is mounted in the IC testing apparatus, in the initialization setting operation at the start of the testing, a delay correcting data stored in the non-volatile memory 24 is transferred to the register RG2 by sending a transfer instruction or command of data from the controller 11 to the non-volatile memory 24. By this transfer of the delay correcting data to the register RG1, the delay time of the variable delay element DY2 is set to a difference of delay time between the prescribed delay time and the propagation delay time of the strobe pulse supply path, and hence the propagation delay time of the strobe pulse supply path provided on each pin card PCAD is in accord with the prescribed delay time. Thus, at the start of the testing, the calibration of the propagation delay time of the strobe pulse supply path provided on each pin card PCAD is completed.

As a result, like the above first embodiment, even if a pin card becomes in trouble or failure during the testing, by replacing the trouble pin card by a new pin card and sending a transfer instruction of the delay correcting data from the controller 11 to the register RG1 of the replaced new pin card, the calibration of the propagation delay time of the new pin card PCAD has been completed. Accordingly, there is obtained an advantage that the IC testing apparatus can be recovered in a short time from the trouble state.

Figure 3:
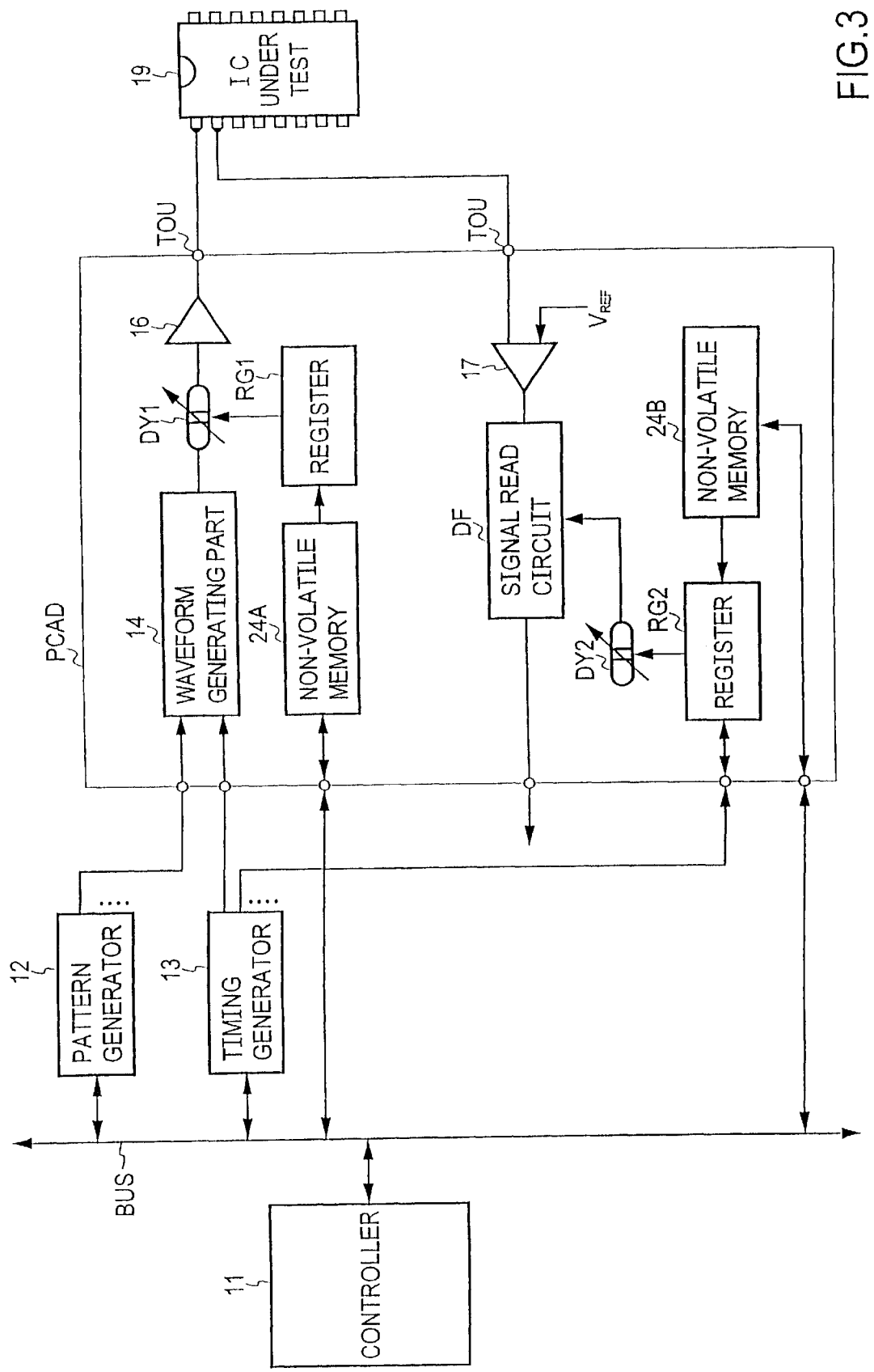
FIG. 3 is a block diagram showing the essential part of the third embodiment of the semiconductor device testing apparatus according to the present invention.
Figure 4:
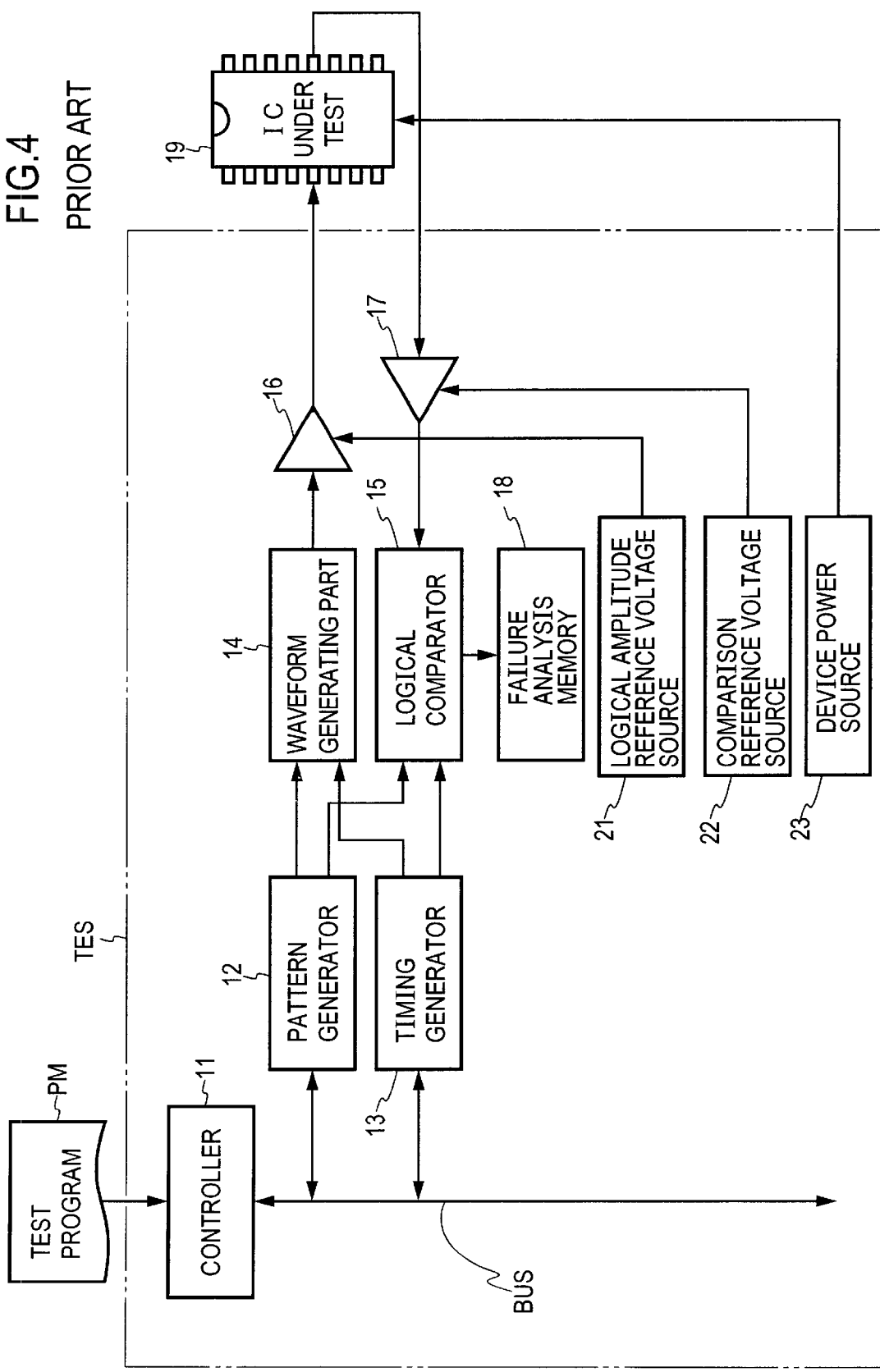
FIG. 4 is a block diagram showing a general configuration of a prior semiconductor device testing apparatus.
Figure 5:
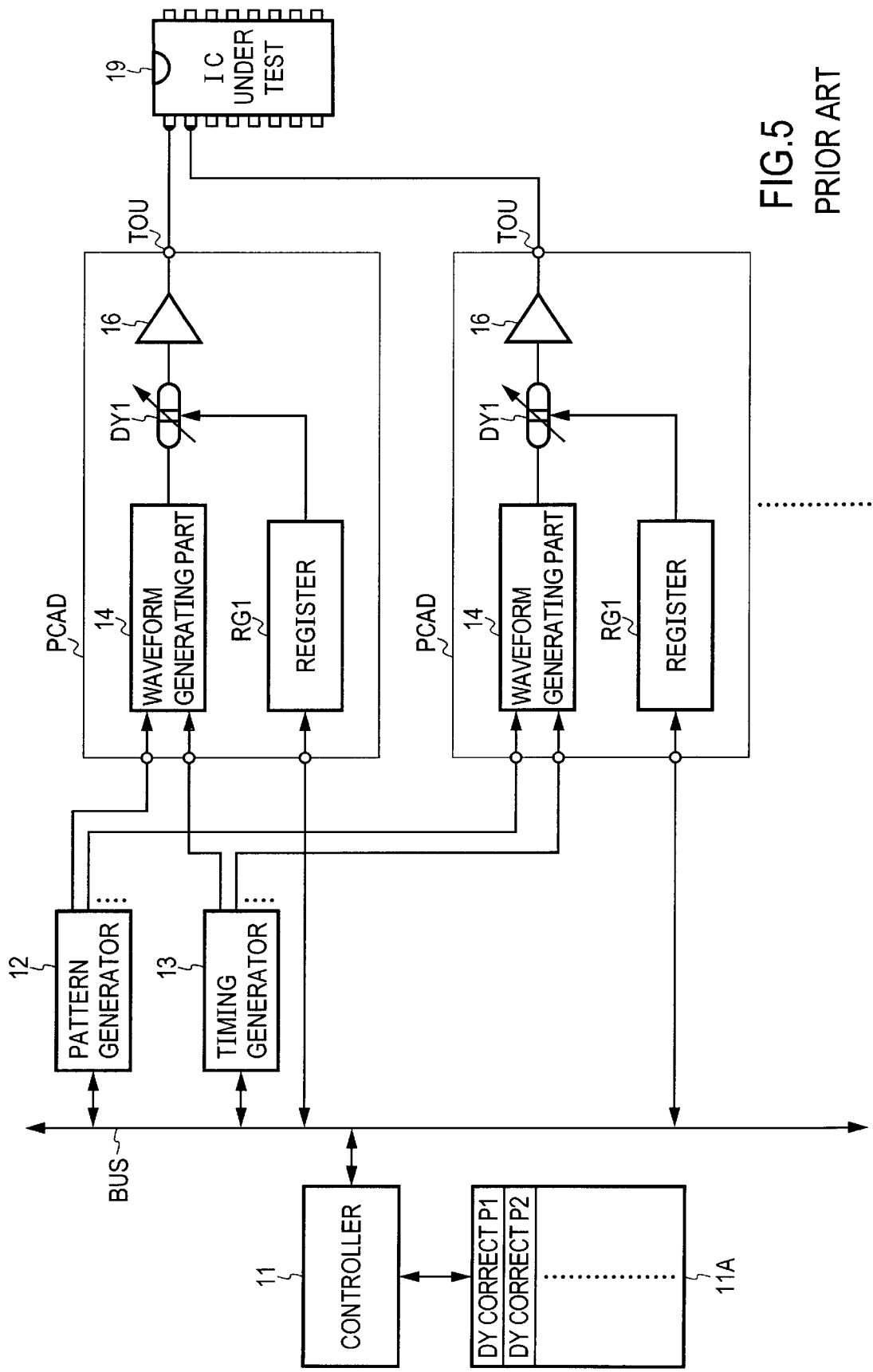
FIG. 5 is a block diagram showing mainly one example of the circuit configuration of a pin card used in the semiconductor device testing apparatus shown in FIG. 4.
Figure 6:
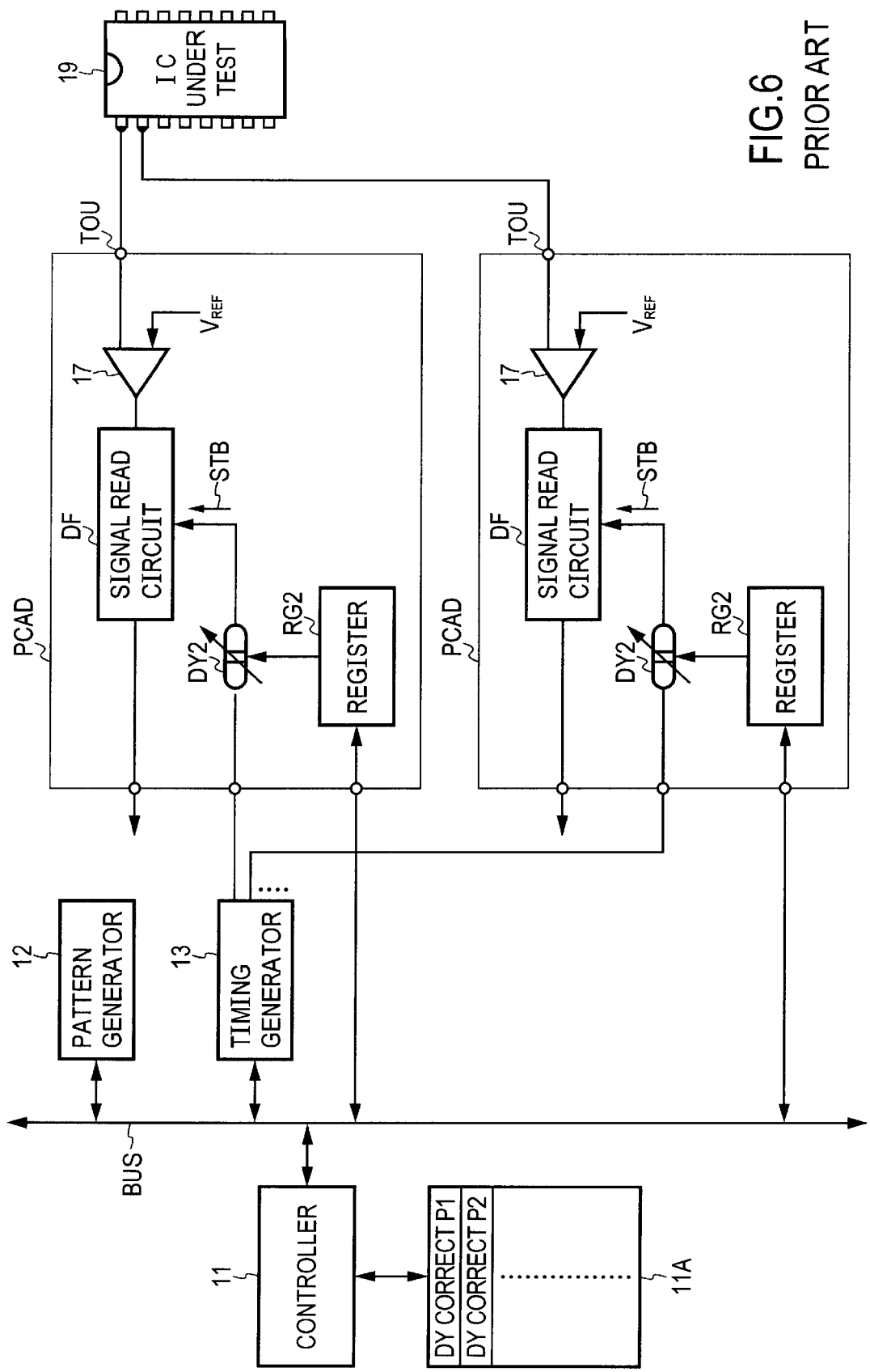
FIG. 6 is a block diagram showing mainly another example of the circuit configuration of the pin card used in the semiconductor device testing apparatus shown in FIG. 4.
Figure 7:
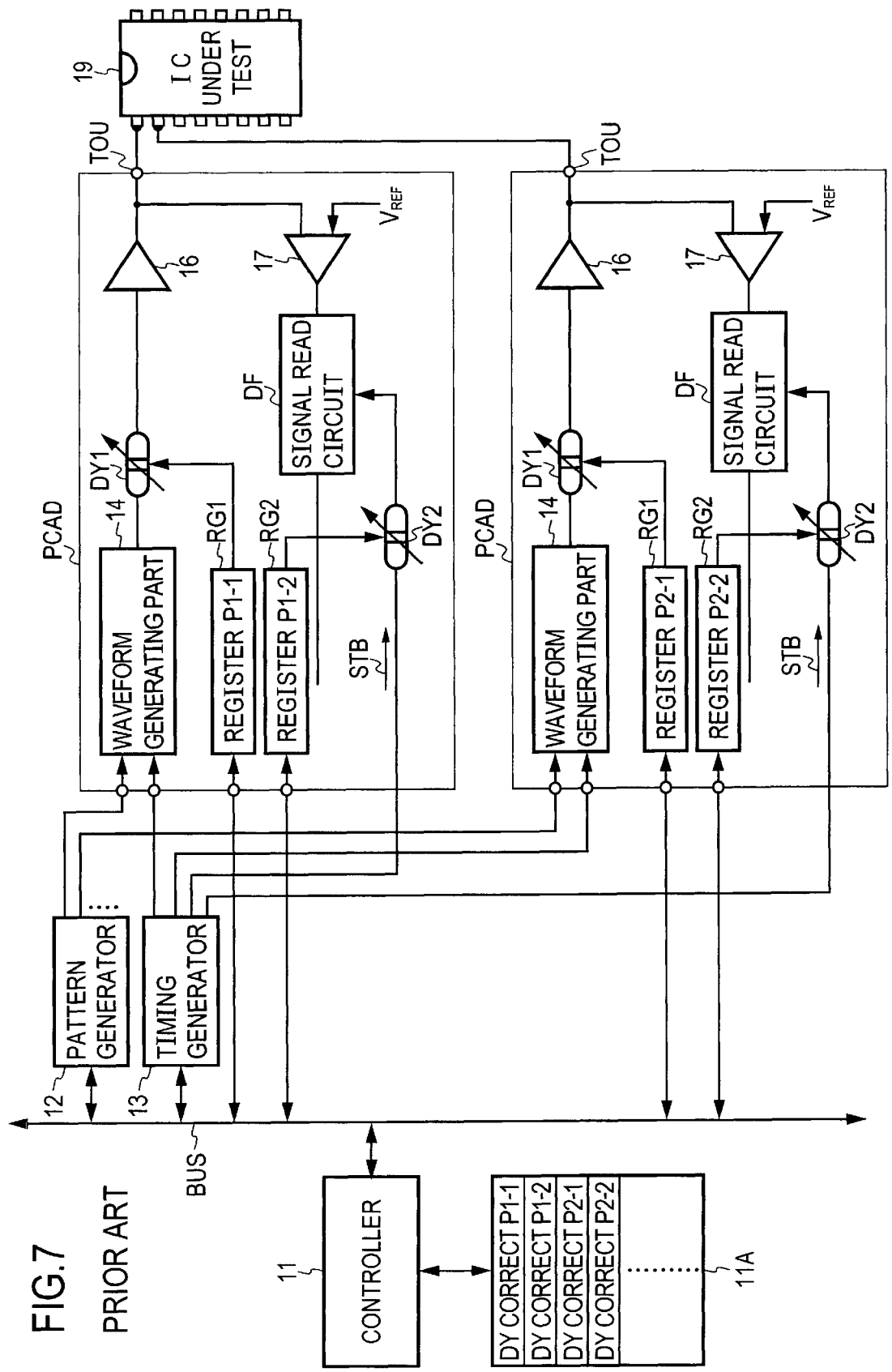
FIG. 7 is a block diagram showing mainly still another example of the circuit configuration of the pin card used in the semiconductor device testing apparatus shown in FIG. 4.

FIG. 3 is a block diagram showing the configuration of the essential part of the third embodiment that the present invention is applied to an IC testing apparatus for testing an IC and determining whether the tested IC is a defective article or not. FIG. 3 shows mainly the circuit configuration of a pin card. The illustrated pin card PCAD is one for input/output terminal corresponding to the aforementioned pin card described with reference to FIG. 7, and includes the waveform generating part 14, the driver 16, the variable delay element DY1, the register RG1 for setting a delay time of the variable delay element DY1, the comparator 17, the signal read circuit DF, the variable delay element DY2, and the register RG2 for setting a delay time of the variable delay element DY2, as described before. The present invention is applied to such input/output (I/O) terminal pin card PCAD thus constructed.

In the third embodiment, there are provided two separate non-volatile memories 24A and 24B on each pin card PCAD, and a delay correcting data to be set in the variable delay element DY1 is stored in one non-volatile memory 24A, and a delay correcting data to be set in the variable delay element DY2 is stored in the other non-volatile memory 24B. These non-volatile memories 24A and 24B are connected to the registers RG1 and RG2 respectively, and delay correcting data stored in the respective non-volatile memories 24A and 24B are transferred to the registers RG1 and RG2 respectively at the start of the testing.

As described in the above first embodiment, in the state of a single pin card PCAD, a signal propagation delay time of the test pattern supply path from an output terminal of the waveform generating part 14 until an output terminal TOU of the pin card PCAD is measured, and it is proper to find difference between the measured delay time and the prescribed delay time and to store the difference value in the one non-volatile memory 24A as a delay correcting data. Also, as described in the above second embodiment, in the state of a single pin card PCAD, a signal propagation delay time of the strobe pulse supply path through which a strobe pulse STB is supplied to the signal read circuit DF is measured, and it is proper to find difference between the measured delay time and the prescribed delay time and to store the difference value in the other non-volatile memory 24B as a delay correcting data.

With the construction mentioned above, in respect of any one of the pin cards PCAD, by setting the delay correcting data stored in the respective non-volatile memories 24A and 24B in the registers RG1 and RG2 of each pin card PCAD, the propagation delay time of the test pattern supply path and the propagation delay time of the strobe pulse supply path in each pin card PCAD can be adjusted to the respective predetermined delay times.

Accordingly, in case that this pin card PCAD is mounted in the IC testing apparatus, in the initialization setting operation at the start of the testing, both delay correcting data stored in the respective non-volatile memories 24A and 24B are transferred to the registers RG1 and RG2 respectively by sending a transfer instruction or command of data from the controller 11 to the respective non-volatile memories 24A and 24B. By this transfer of the delay correcting data to the registers RG1 and RG2, the delay times of the respective variable delay elements DY1 and DY2 are set to a difference of delay time between the prescribed delay time and the propagation delay time of the test pattern supply path and a difference of delay time between the prescribed delay time and the propagation delay time of the strobe pulse supply path respectively, and hence the propagation delay time of the test pattern supply path and the propagation delay time of the strobe pulse supply path provided on each pin card PCAD are in accord with the respective prescribed delay times. Thus, at the start of the testing, the calibrations of the propagation delay time of the test pattern supply path and of the propagation delay time of the strobe pulse supply path provided on each pin card PCAD are completed at the same time.

As a result, like the above first embodiment, even if a pin card becomes in trouble or failure during the testing, by replacing the trouble pin card by a new pin card and sending a transfer instruction of the delay correcting data from the controller 11 to the two registers RG1 and RG2 of the replaced new pin card, the calibrations of the propagation delay times of the new pin card PCAD has been completed. Accordingly, there is obtained an advantage that the IC testing apparatus can be recovered in a short time from the trouble state.

Further, in the third embodiment, the separate two non-volatile memories 24A and 24B are prepared on each pin card PCAD. However, in reality, the pin card is constructed such that one non-volatile memory, for example, a flash memory is prepared on the pin card, and both delay correcting data of the test pattern supply path and of the strobe pulse supply path are stored in the different addresses of the flash memory, respectively.

In addition, in each of the embodiments, the description is made such that only a delay correcting data is stored in the non-volatile memory 24 or memories 24A and 24B. However, the pin card may be configured such that not only delay correcting data but also other correction data related to the pin card are stored in the non-volatile memory 24 or memories 24A and 24B, and the controller 11 read therein those correction data at the start of the testing apparatus, thereby to carry out the initialization of various portions.

In addition, in each of the embodiments, there is shown by way of example a case that one test pattern supply path and/or one strobe pulse supply path are provided on one pin card PCAD. However, in reality, there can be found many cases that a plurality of channels of the test pattern supply paths and/or a plurality of the strobe pulse supply paths are provided on one pin card. It is apparent that the present invention is also applied to such types of configurations that a plurality of channels of the test pattern supply paths and/or a plurality of the strobe pulse supply paths are provided on one pin card, and that the same functional effects can be obtained. Accordingly, it will be easily understood that pin cards of such configurations also fall within the scope of the present invention.

In addition, in the first embodiment shown in FIG. 1, there is shown a case in which the IC testing apparatus is constituted by only pin cards each having a test pattern supply path provided thereon, and in the second embodiment shown in FIG. 2, there is shown a case in which the IC testing apparatus is constituted by only pin cards each having a strobe pulse supply path. However, in reality, there are no IC testing apparatus each having such construction. It would be easily understood that an IC testing apparatus is constituted by combination of the pin cards shown in FIG. 1, the pin cards shown in FIG. 2 and the pin cards shown in FIG. 3 in mixture.

Further, it is needless to say that the present invention is also applied to an IC testing apparatus configured such that without using any pin card, a test pattern signal is supplied to an IC under test through a test pattern supply path as shown in the above embodiments and that a strobe pulse is supplied to a signal read circuit through a strobe pulse supply path as shown in the above embodiments, and that the same functional effects can be obtained.

Furthermore, in each of the above embodiments, though the present invention is applied to the IC testing apparatus, it goes without saying that the present invention is also applied to a semiconductor device testing apparatus for testing semiconductor devices other than IC and the same functional effects can be obtained.

As is clear from the foregoing description, according to the present invention, each pin card is prepared in the state that delay correcting data is previously stored therein. Accordingly, it is unnecessary to execute the operation or working for measuring, every time a pin card is replaced, the signal propagation delay time or times of the test pattern supply path and/or the strobe pulse supply path provided on that pin card, and obtaining delay correcting data to store them in the controller of the testing apparatus. Therefore, even if any trouble or defect occurs in a pin card and even if the trouble pin card is replaced by any new pin card, the testing apparatus can be re-started immediately after the new pin card is mounted, and hence the interrupted time duration of the testing can be decreased significantly, and an improvement of the throughput can be attained.

Moreover, when the testing apparatus is re-started, there is no possibility that an incorrect operation occurs that the testing apparatus operates by using delay correcting data for the former trouble pin card. Consequently, a highly reliable semiconductor device testing apparatus can be provided.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A semiconductor device testing apparatus comprising:
   a signal read circuit for reading therein a logical value of a response signal outputted from a semiconductor device under test;
   a strobe pulse supply path through which a strobe pulse is supplied to said signal read circuit, said strobe pulse giving to said signal read circuit a timing at which the signal read circuit reads therein the logical value;
   a variable delay element for adjusting signal propagation delay time of said strobe pulse supply path;
   a register for setting a delay time of said variable delay element;
   a non-volatile memory;
   delay correcting data setting means for causing delay correcting data to be stored in said non-volatile memory, said delay correcting data correcting the signal propagation delay time of said strobe pulse supply path to a prescribed value; and
   data transfer means for causing the delay correcting data stored in said non-volatile memory to be transferred to said register.

2. The semiconductor device testing apparatus as set forth in claim 1, wherein said signal read circuit, said strobe pulse supply path, said variable delay element, said register and said non-volatile memory are provided on a pin card.

3. The semiconductor device testing apparatus as set forth in claim 2, wherein said signal propagation delay time of said strobe pulse supply path is measured before said board is mounted in the semiconductor device testing apparatus.

4. The semiconductor device testing apparatus as set forth in claim 2, wherein said delay correcting data stored in said non-volatile memory is transferred to said register by a controller for controlling the operation of the semiconductor device testing apparatus that outputs a transfer instruction of delay correcting data to the non-volatile memory in the initialization setting operation thereof at the start of a testing, thereby to calibrate the signal propagation delay time of said strobe pulse supply path to the prescribed value.

5. The semiconductor device testing apparatus as set forth in claim 1, wherein said delay correcting data is a difference value between the signal propagation delay time of said strobe pulse supply path and said prescribed value.

6. The semiconductor device testing apparatus as set forth in claim 1, wherein said delay correcting data stored in said non-volatile memory is transferred to said register by a controller for controlling the operation of the semiconductor device testing apparatus that outputs a transfer instruction of delay correcting data to the non-volatile memory in the initialization setting operation thereof at the start of a testing, thereby to calibrate the signal propagation delay time of said strobe pulse supply path to the prescribed value.

7. The semiconductor device testing apparatus as set forth in claim 1, wherein a circuit configuration constituted by said signal read circuit, said strobe pulse supply path, said variable delay element, said register and said non-volatile memory is provided with plural channels on a pin card, and delay correcting data for correcting the signal propagation delay time of each of the strobe pulse supply paths to said prescribed value is stored in corresponding one of the non-volatile memories.

8. The semiconductor device testing apparatus as set forth in claim 7, wherein the plurality of delay correcting data stored in said respective non-volatile memories are transferred to the corresponding registers respectively by a controller for controlling the operation of the semiconductor device testing apparatus that outputs a transfer instruction of delay correcting data to the plural non-volatile memories in the initialization setting operation thereof at the start of a testing, thereby to calibrate the signal propagation delay times of the corresponding strobe pulse supply paths to the prescribed value.

9. The semiconductor device testing apparatus as set forth in claim 1, wherein a circuit configuration constituted by said signal read circuit, said strobe pulse supply path, said variable delay element and said register is provided with plural channels on a pin card as well as said non-volatile memory is used in common to the respective strobe pulse supply paths in the plural channels, and delay correcting data for correcting the signal propagation delay time of each of the strobe pulse supply paths to said prescribed value is stored in said non-volatile memory.

10. The semiconductor device testing apparatus as set forth in claim 9, wherein the plurality of delay correcting data stored in said non-volatile memory are transferred to the corresponding registers respectively by a controller for controlling the operation of the semiconductor device testing apparatus that outputs a transfer instruction of delay correcting data to the non-volatile memory in the initialization setting operation thereof at the start of a testing, thereby to calibrate the signal propagation delay times of the corresponding strobe pulse supply paths to the prescribed value.

* * * * *